United States Patent
Mishima et al.

(10) Patent No.: US 7,224,101 B2
(45) Date of Patent: May 29, 2007

(54) ELASTIC BOUNDARY WAVE DEVICE AND METHOD OF MANUFACTURING THE SAME

(75) Inventors: Naoyuki Mishima, Yokohama (JP); Michio Miura, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 148 days.

(21) Appl. No.: 10/984,836

(22) Filed: Nov. 10, 2004

(65) Prior Publication Data

US 2005/0099091 A1 May 12, 2005

(30) Foreign Application Priority Data

Nov. 12, 2003 (JP) ............... 2003-382346

(51) Int. Cl.
*H01L 41/08* (2006.01)
(52) U.S. Cl. ............... 310/313 A; 310/313 R
(58) Field of Classification Search ......... 310/313 A, 310/313 R, 313 B; 333/193–196
See application file for complete search history.

(56) References Cited

U.S. PATENT DOCUMENTS 5,838,089 A * 11/1998 Dreifus et al. .......... 310/313 A
5,923,231 A * 7/1999 Ohkubo et al. ............ 333/193
6,046,656 A * 4/2000 Mishima .................. 333/141
6,806,795 B2 * 10/2004 Shin ........................ 333/193
7,109,828 B2 * 9/2006 Takayama et al. ......... 333/193

FOREIGN PATENT DOCUMENTS

JP 6-326553 A 11/1994
JP 11-340268 A 12/1999

OTHER PUBLICATIONS

International Publication No. WO 98/51011, published Nov. 11, 1998.
"Highly Piezoelectric Boundary Waves in Si/SiO$_2$/LiNbO$_3$ Structure", Japan Society for the Promotion of Science, Takashi Yamashita, et al., Jul 11, 1997, pp. 19-24, with English abstract.
Hideki Takagi; Room-Temperature Bonding of Silicon Wafers by means of the Surface Activation Method; *Report of Mechanical Engineering Laboratory No. 189*; Dec. 2000; pp. 76-84.

* cited by examiner

*Primary Examiner*—Mark Budd
(74) *Attorney, Agent, or Firm*—Arent Fox LLP (57) ABSTRACT

An elastic boundary wave device includes a first piezoelectric substrate, IDTs arranged thereon, a first dielectric film having a smoothed surface that covers the IDTs, a second substrate that is a silicon-based substrate, and a second dielectric film provided on a main surface of the second substrate. The smoothed surface of the first dielectric surface and a surface of the second dielectric film are joined together.

6 Claims, 8 Drawing Sheets

ELASTIC BOUNDARY WAVE DEVICE AND METHOD OF MANUFACTURING THE SAME

BACKGROUND OF THE INVENTION

1. Field of the Invention

This invention generally relates to an elastic boundary wave device and a method of manufacturing the same, and more particularly, to an elastic boundary wave device employed for a filter or oscillator on a television set, cellular phone, or PHS (Personal Handyphone System), and a method of manufacturing the same.

2. Description of the Related Art

Conventionally, a surface acoustic wave device (hereinafter referred to as SAW device) has been known well as one of the devices that utilize elastic waves. The SAW device is employed in various types of circuits on devices that send and receive wireless signals, for instance, in a frequency range of 45 MHz to 2 GHz. Examples of the above-mentioned various types of circuits are a bandpass filter for transmission and reception, local oscillation filter, antenna duplexer, IF filter, and FM modulator.

The SAW device utilizes elastic waves that travel on an interface between a solid surface and vacuum or gas, that is, the SAW device utilizes the elastic waves that travel on the solid surface. Therefore, a piezoelectric substrate is required to have a free surface so as to serve as a propagation medium. This does not allow the SAW device to be covered with plastic mold, which is generally used for packaging semiconductor devices. In order to obtain the free surface, it is necessary to have a hollow portion inside the package. However, the use of the hollow portion in the package may cause a problem in that the SAW device is relatively expensive and large-scaled.

In contrast, in recent years, the boundary wave devices have been studied. The boundary wave devices utilize the elastic wave that travels on the boundary surface between solids, as disclosed in International Publication Number WO 98/51011 (hereinafter referred to as Document 1) and Yamashita et al., "Highly Piezoelectric Boundary Waves in Si/SiO$_2$/LiNbO$_3$ Structure", Japan Society for the Promotion of Science, The 150$^{th}$ Committee of Elastic Surface Wave Device Technique, The 53rd Study Material, Jul. 11, 1997, pp. 19-24 (hereinafter referred to as Document 2). The boundary wave device is an elastic wave device that utilizes the elastic wave traveling on the interface between two solids that are in contact with each other. The elastic wave of the boundary wave device propagates in the vicinity of the boundary of two substrates. Therefore, the boundary wave device has no limitation on the propagation surface. This is different from the SAW device, because the piezoelectric substrate of the SAW device is required to have a free surface. The boundary wave device has an advantage in that the size and cost of the package can be reduced easily, and in addition, the boundary wave device is able to obtain capabilities equivalent to those of the SAW devices.

Figure 1:
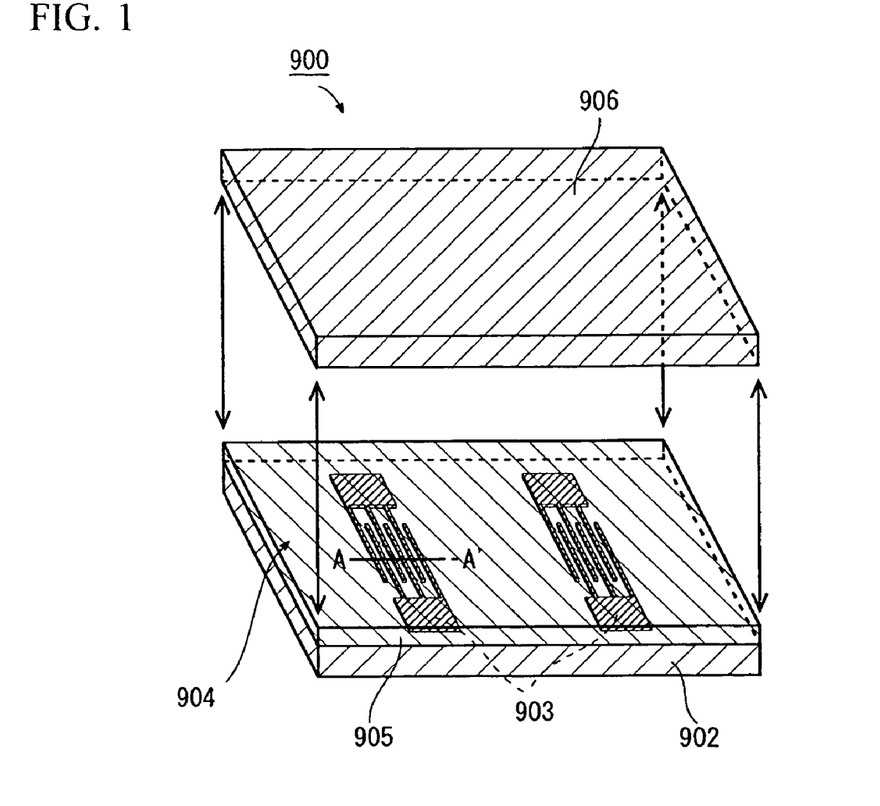
FIG. 1 is an exploded perspective view of an elastic boundary wave device 900.
Figure 2:
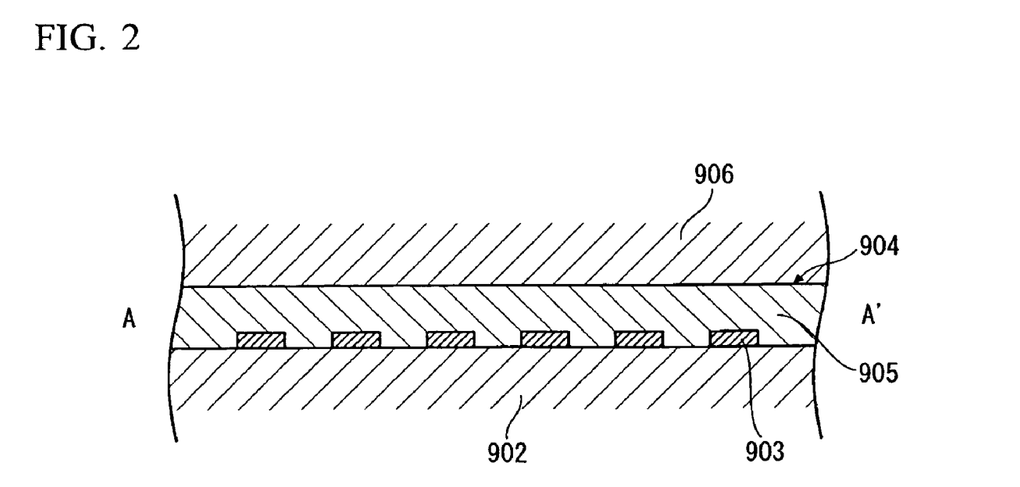
FIG. 2 is a cross-sectional view taken along a line A-A' shown in FIG. 1.

The elastic boundary wave devices disclosed in Documents 1 and 2 will be described, with reference to the accompanying drawings. FIG. 1 is an exploded perspective view of an elastic boundary wave device 900. FIG. 2 is a cross-sectional view taken along a line A-A' shown in FIG. 1. Referring to FIGS. 1 and 2, the elastic boundary wave device 900 includes a first substrate 902 which is a piezoelectric substrate, comb-like electrodes 903 (interdigital transducer, hereinafter referred to as IDT) which are arranged on the first substrate 902, a second substrate 906 which is a silicon(Si)-based substrate. The first substrate 902 and the second substrate 906 are respectively joined to a dielectric film 905 that forms an interposer. The dielectric film 905 covers the IDTs 903 and has a smoothed surface 904. The second substrate 906 is joined to the smoothed surface 904.

As shown in FIG. 1, a piezoelectric substrate made of LiNbO$_3$ is used for the first substrate 902. A silicon substrate is used for the second substrate 906. All of the above-mentioned substrates have negative temperature coefficients of phase velocity (hereinafter referred to as TCV). Document 2 discloses that the SiO$_2$ film having a positive TCV is employed for the dielectric film 905. Document 2 also discloses that the joining interface has a high electromechanical coupling coefficient and there exists boundary waves having zero-temperature characteristics when the interface is defined by an SiO$_2$ film that is interposed between the LiNbO$_3$ substrate and the silicon substrate and has a TCV opposite to those of these substrates.

Document 1 has proposed a manufacturing process of the above-mentioned boundary wave device 900, which will be described, with reference to FIGS. 3A through 3D and 4.

Figure 3A:
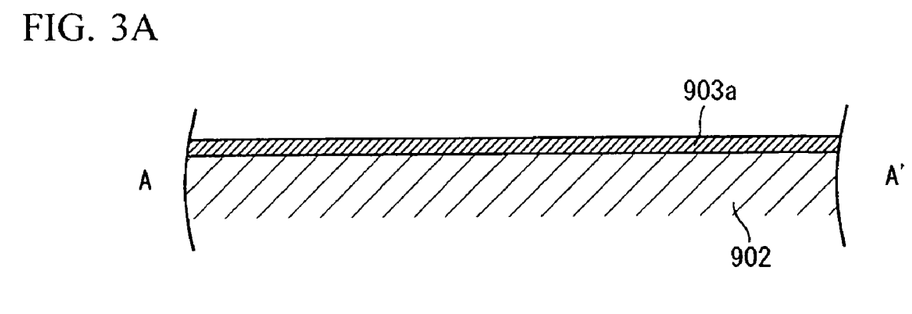
FIGS. 3A through 3D show a manufacturing process of the elastic boundary wave device 900, in accordance with a conventional technique.
Figure 3B:
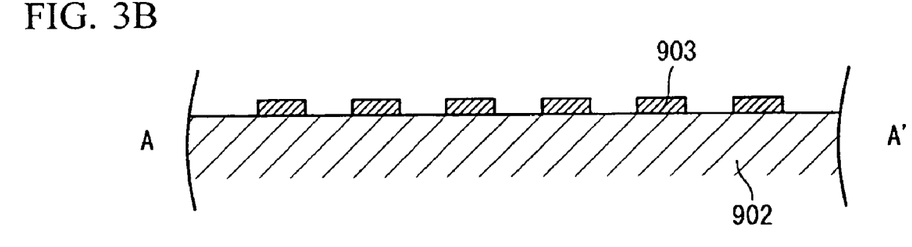
Figure 3C:
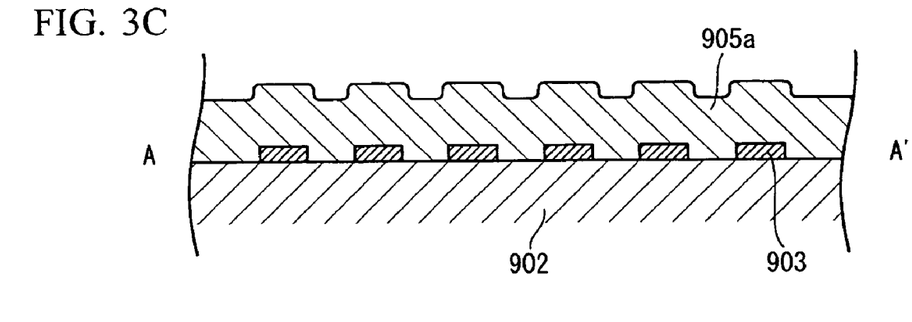
Figure 3D:
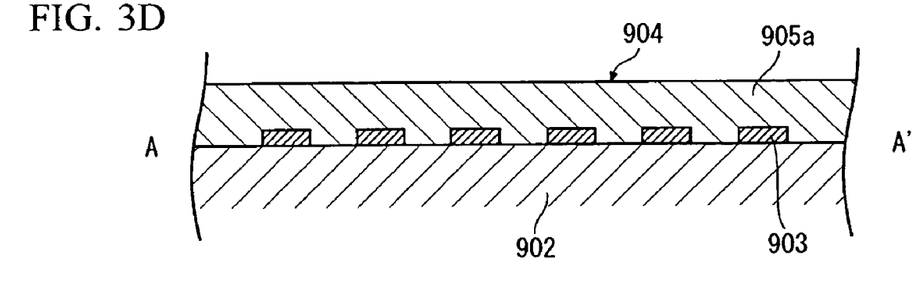

Referring to FIG. 3A, a metal film 903a made of, for example, aluminum (Al) is deposited on a first main surface (herein after referred to as upper surface) of the first substrate 902. This is performed by, for example, sputtering. Next, referring to FIG. 3B, the metal film 903a is processed by etching in order to define multiple IDTs 903, interconnection patterns and terminal patterns (hereinafter referred to as metal patterns), which are connected to the multiple IDTs 903. Referring to FIG. 3C, a dielectric film 905a made of, for example, SiO$_2$ is provided on the surface of the first substrate 902 on which the metal patterns have been arranged. This is performed by, for example, sputtering. Then, referring to FIG. 3D, a dielectric film 905a having a smoothed surface 904 is formed by polishing the surface of the dielectric film 905a.

Figure 4:
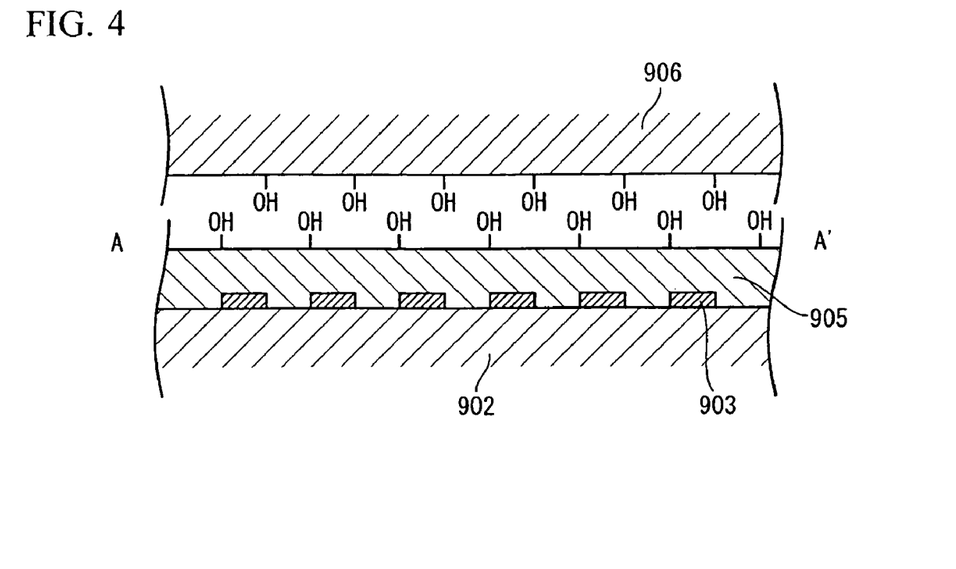
FIG. 4 shows the manufacturing process of the elastic boundary wave device 900, in accordance with the conventional technique.

Next, referring to FIG. 4, surface processing is performed on the smoothed surface 904 and a lower surface of the second substrate 906 respectively to be joined together. This is to hydrate the above-mentioned surfaces with ammonia water, for example. Then, the hydrated smoothed surface 904 and lower surface of the second substrate 906 are brought into contact, and are heated at approximately 300° C. for one to two hours. Thus, OH groups on the respectively joined surfaces form a chemical union, while H$_2$O is liberated, so that the dielectric film 905 and the second substrate 906 can be joined together, although the dielectric film 905 and the second substrate 906 are heterogeneous substrates.

As described above, it is necessary to form a relatively thick dielectric film of approximately 2.4 μm in order to produce the boundary wave device having the zero-temperature characteristic, even in a relatively high frequency range of around 1 GHz. However, in the case where the above-mentioned dielectric film is formed by sputtering, for example, generally, the first substrate 902 may be warped significantly due to internal stress of the dielectric film. Therefore, there is another problem in that joining strength cannot be maintained evenly on the entire joined surfaces of the dielectric film and the second substrate 906.

Besides, when the first substrate 902 and the second substrate 906 are joined together, after hydrating the both surfaces of the dielectric film 905 formed on the first substrate 902 and the second substrate 906, it is necessary to heat the both surfaces at approximately 300° C. for one to two hours. However, in the case where the substrates are joined with the above-mentioned thermal treatment and are cooled down to room temperature, there is yet another problem in that the joined substrates are warped because of the difference in thermal expansion coefficient between the first substrate 902 and the second substrate 906. Further, in the case where a process is performed on the above-mentioned warped substrates so as to expose an electrode or the like, there is a further problem in that uniform exposure cannot be achieved with a light exposure process or the like.

SUMMARY OF THE INVENTION

It is a general object of the present invention to provide an elastic boundary wave device and methods of manufacturing the same.

According to an aspect of the present invention, there is provided an elastic boundary wave device including, a first piezoelectric substrate that has comb-like electrodes that excite elastic waves and are arranged on a main surface thereof, a first dielectric film that covers the comb-like electrodes and has a smoothed surface, in which a second substrate having a second dielectric film arranged on a main surface thereof, and the smoothed surface of the first dielectric film and the second dielectric film being joined together.

According to another aspect of the present invention, there is provided an elastic boundary wave device including, a first piezoelectric substrate that has comb-like electrodes that excite elastic waves and are arranged on a main surface thereof, a dielectric film that covers the comb-like electrode, a thin film that covers the dielectric film and has a smoothed surface, and a second substrate, in which the thin film and the second substrate being joined together.

According to another aspect of the present invention, there is provided a method of manufacturing an elastic boundary wave device including, arranging comb-like electrodes on a main surface of a first substrate, forming a first dielectric film on the main surface of the first substrate to cover the comb-like electrodes, smoothing a surface of the first dielectric film, forming a second dielectric film on a surface of a second substrate, and joining the first dielectric film and the second dielectric film together, in which the comb-like electrodes that excite elastic waves being sandwiched between the first substrate and the second substrate.

According to another aspect of the present invention, there is provided a method of manufacturing an elastic boundary wave device including, arranging comb-like electrodes on a main surface of a first substrate, forming a dielectric film on the main surface of the first substrate to cover the comb-like electrodes, smoothing a surface of the dielectric film, forming a thin film on a smoothed surface of the dielectric film, and joining the thin film and a second substrate together, in which the comb-like electrodes that excite elastic waves are sandwiched between the first substrate and the second substrate.

According to another aspect of the present invention, there is provided a method of manufacturing an elastic boundary wave device including, arranging comb-like electrodes on a main surface of a first substrate, forming a dielectric film on the main surface of the first substrate to cover the comb-like electrodes, arranging a thin film on a surface of the dielectric film, smoothing the surface of the thin film, and joining the thin film and a second substrate together, in which the comb-like electrodes that excite elastic waves are sandwiched between the first substrate and the second substrate.

BRIEF DESCRIPTION OF THE DRAWINGS

Preferred embodiments of the present invention will be described in detail with reference to the following figures, wherein.

DESCRIPTION OF THE PREFERRED EMBODIMENTS

First Embodiment

A description will now be given of embodiments of the present invention, with reference to the accompanying drawings.

Figure 5:
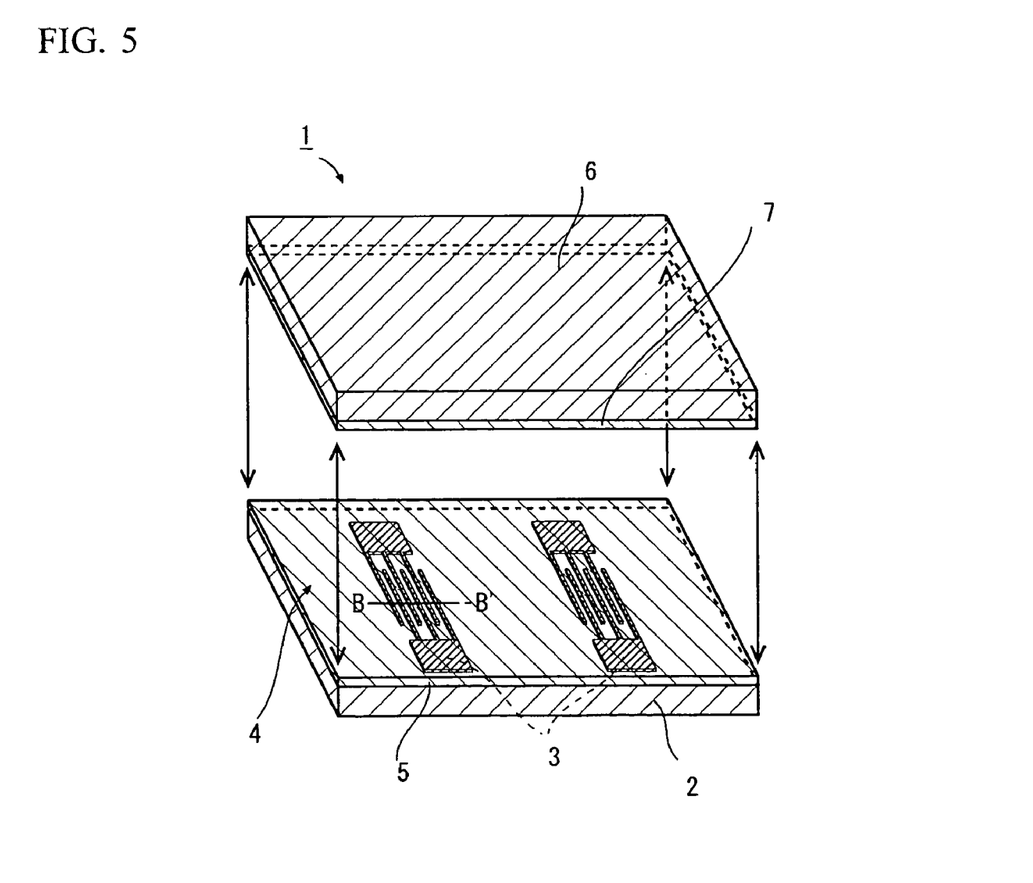
FIG. 5 is an exploded perspective view of an elastic boundary wave device 1 in accordance with a first embodiment of the present invention.
Figure 6:
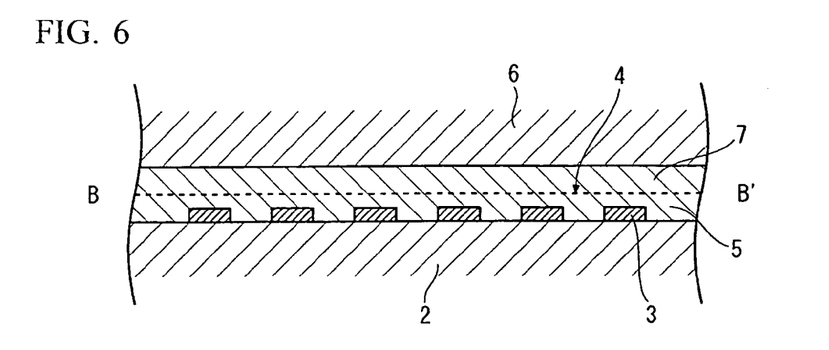
FIG. 6 is a cross-sectional view taken along a line B-B' shown in FIG. 5.

A first embodiment will be described, with reference to FIG. 5. FIG. 5 is an exploded perspective view of an elastic boundary wave device 1 in accordance with the first embodiment. FIG. 6 is a cross-sectional view taken along a line B-B' shown in FIG. 5. A description will be given under the assumption that the elastic boundary wave device 1 has the purpose of processing high frequency signals in a frequency range of 1 GHz.

Referring to FIGS. 5 and 6, the elastic boundary wave device 1 includes a first substrate 2 that is a piezoelectric substrate, comb-like electrodes (IDTs) 3 that are arranged on a main surface of the first substrate 2, a first dielectric film 5 that covers the IDTs 3 and that has a smoothed surface 4, a silicon-based second substrate 6, and a second dielectric film 7 provided on a main surface of the second substrate 6. The smoothed surface 4 of the first dielectric film 5 and a surface of the second dielectric film 7 are joined together. That is, dielectric materials are joined together in accordance with the first embodiment of the present invention. The second dielectric film 7 also has a smoothed surface.

A lithium niobate (LiNbO$_3$) substrate, for instance, may be employed for the first substrate 2. However, The first substrate 2 may be a lithium tantalite (LiTaO$_3$) substrate or a piezoelectric substrate made of quartz.

The above-mentioned silicon-based substrate may be employed for the second substrate 6. The silicon-based substrate may be a silicon substrate, amorphous silicon substrate, or poly-silicon substrate. Not only the silicon-based substrate but also another material may be used for the substrate if the boundary wave having a sufficient magnitude can be generated in the vicinity of the interface with the first piezoelectric substrate 2. A description will be given of the silicon substrate that is used for the second substrate 6, in accordance with the first embodiment of the present invention. It is to be noted that there exist the dielectric films 5 and 7 between the IDTs 3 and the second substrate 6, as will be described later in detail. Thus, direct current leakage from the IDTs 3 is reduced through the dielectric films 5 and 7. Therefore, it is possible to use a silicon substrate that is not absolutely pure, in accordance with the first embodiment of the present invention. That is, it is possible to use the silicon substrate in which impurities are doped on purpose so as to reduce specific resistance of n-type or p-type resistor, as is usually used for general integrated circuits. Here, "pure" does not denote complete, and the "pure" includes a case where minute impurities are unexpectedly mixed in.

Aluminum (Al), for instance, may be employed for an electrode material of the IDTs 3. Also, copper (Cu), titanium (Ti), or other materials may be employed. An alloy that contains aluminum (Al), copper (Cu), titanium (Ti), or other materials may be employed. The IDTs 3 may be composed of a single- or multi-layer structure. In other words, the IDTs 3 may be composed of a multi-layer structure of the above-mentioned electrode materials.

The IDTs 3 arranged on the first substrate 2 respectively include at least one IDT 3 for excitation and at least one IDT 3 for reception. Reflector electrodes may be provided so as to sandwich the IDTs 3 in the propagation direction of the boundary wave. An acoustic material may be used instead of the reflector electrodes.

The dielectric films 5 and 7 are interposers provided between the first substrate 2 and the second substrate 6. Preferably, the dielectric films 5 and 7 are made of the same dielectric material, in terms of bondability of the dielectric films 5 and 7. For example, the silicon-based dielectric such as silicon dioxide (SiO$_2$) may be employed for the dielectric films 5 and 7.

In accordance with the first embodiment of the present invention, the first substrate 2 having the dielectric film 5 thereon and the second substrate 6 having the dielectric film 7 thereon are joined together firmly and uniformly without any void. Specifically, joined surfaces are the smoothed surfaces of the respective dielectric films. The dielectric film 5 has the smoothed joining surface 4, and the dielectric film 7 has the smoothed joining surface.

The elastic boundary wave device 1 may have a temperature dependency when the first and second substrates 2 and 6 are made of materials having the same positive or negative sign of the TCV characteristic. For example, the device 1 has a temperature dependency when the substrates 2 and 6 are made of LiNbO$_3$ and Si, respectively. This is because the temperature characteristics of the substrates are not canceled out. Therefore, in accordance with the first embodiment of the present invention, the dielectric films 5 and 7 interposed between the first and the second substrates 2 and 6 are made of materials having the temperature coefficients of phase velocity opposite to those of the first substrate 2 and the second substrate 6. This cancels out the temperature dependency of the first substrate 2 and the second substrate 6 respectively, and thereby makes it possible to realize the elastic boundary wave device 1 capable of operating stably against any temperature change.

More preferably, the total thickness of the dielectric films 5 and 7 is approximately 0.6 times as long as the wavelength λ of the propagated boundary wave. For example, when the LiNbO$_3$ substrate 2 and the Si substrate 6 are used and the SiO$_2$ dielectric films 5 and 7 are used, and the total thickness of the dielectric films 5 and 7 may be set equal to approximately 0.6λ, so that a high electro-mechanical coupling coefficient and the zero-temperature characteristic are obtainable. The total thickness is 2.4 μm when the boundary wave device has an operating frequency of 1 GHz, and the total thickness is 12 μm for an operating frequency of 200 MHz. The linear expansion coefficient $\alpha_{11}$ of Si is 3.35 [ppm/° C.] and the TCV thereof is −17.0 [ppm/° C.]. The linear expansion coefficient $\alpha_{11}$ of LiNbO$_3$ is 15.4 [ppm/° C.] and the TCV thereof ranges from −80 to −50 [ppm/° C.]. It is to be noted that the above-mentioned values are related to the propagation direction X of the boundary wave. In contrast, the linear expansion coefficient $\alpha_{11}$ of SiO$_2$ is 0.55 [ppm/° C.] and the TCV thereof is 119.5 [ppm/° C.].

The total thickness of the dielectric films 5 and 7 is not limited to 0.6λ, and may be varied diversely depending on the substrate material or crystal orientation of the first substrate 2 and the second substrate 6. That is, an optimal value of the total thickness depends on the substrate material or crystal orientation of the first substrate 2 and the second substrate 6. Therefore, it is necessary to select the total thickness appropriately so that a frequency temperature characteristic of the elastic boundary wave device 1 shows the zero-temperature characteristic. Roughly, the total thickness may range from 0.5 to 1λ.

Next, a description will be given of a manufacturing method of the elastic boundary wave device 1 in accordance with the first embodiment, with reference to the accompanying drawings. FIGS. 7A through 7D and FIGS. 8A and 8B show a process of manufacturing the elastic boundary wave device 1.

Figure 7A:
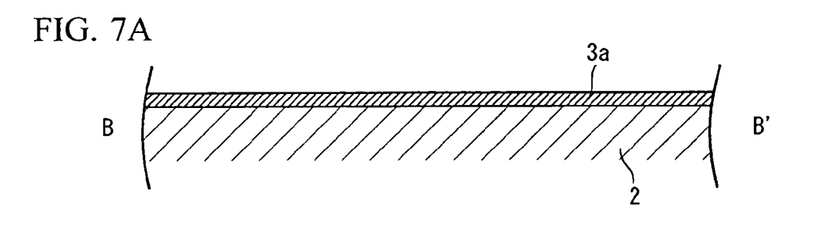
FIGS. 7A through 7D show a manufacturing process of an elastic boundary wave device 1 in accordance with the first embodiment of the present invention.

Referring to FIG. 7A, an aluminum (Al) film 3a having a given thickness is deposited on the main surface of the first substrate 2. Here, the given thickness corresponds to the height (or thickness) of the IDT 3. The given thickness may be 0.005λ to 0.15λ, which is approximately equal to 0.02 to 0.6 μm. The aluminum film 3a is formed by, for example, evaporation or sputtering.

Figure 7B:
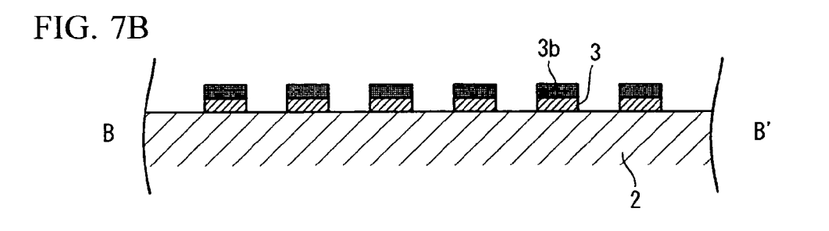

Referring to FIG. 7B, a resist 3b of a given pattern is provided on the aluminum film 3a, which is then etched. The IDTs 3 are thus produced. The given pattern denotes a pattern for shaping the aluminum film 3a into the IDTs 3 and the interconnection pattern and terminal pattern (hereinafter referred to as metal pattern), which patterns are connected to the IDTs 3. The resist 3b is removed after the IDTs 3 are defined. Etching is employed as shown in FIG. 7B; however, a liftoff process may be employed. The liftoff process uses a resist having a pattern opposite to the above-mentioned given pattern provided on the main surface of the first substrate 2. After the aluminum film is deposited, the portions of the aluminum on the resist patterns are removed together with the resist. In this manner, the IDTs 3 can be defined. The above-mentioned process forms the metal pattern including the IDTs 3 on the main surface of the first substrate 2.

Figure 7C:
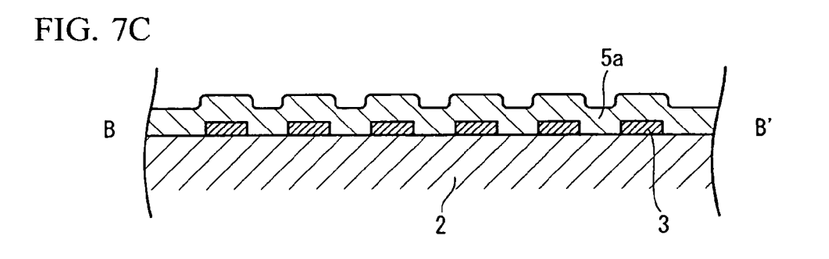

After the IDTs 3 are thus provided, the $SiO_2$ film 5a is provided on the above-mentioned main surface of the first substrate 2, namely, on the surface on which the IDTs 3 are provided, as shown in FIG. 7C. This can be performed by sputtering, for example. The $SiO_2$ film 5a may be thicker than the IDTs 3. For example, the $SiO_2$ film 5a may have a thickness equal to $0.06\lambda$ to $0.3\lambda$, which is approximately equal to 0.24 to 1.2 µm.

Figure 7D:
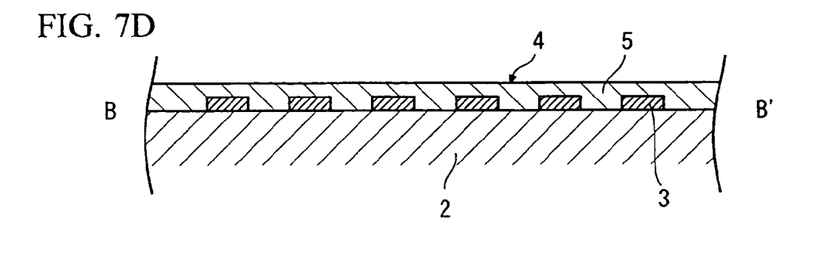

The $SiO_2$ film 5a thus provided has an uneven surface. The unevenness results from an uneven surface of the IDTs 3. Referring to FIG. 7D, the $SiO_2$ film 5a is polished to smooth the surface thereof. Thus, the dielectric film 5 has the smoothed surface. Chemical mechanical polishing (CMP) may be employed for the above-mentioned polishing. The dielectric film 5 may be polished to a lower limit of the thickness equal to those of the IDTs 3. The upper limit is the total thickness of the dielectric films 5 and 7 interposed between the first substrate 2 and the second substrate 6. The thickness of the dielectric film 5 denotes the length from the first substrate 2 to the surface of the dielectric film 5. The dielectric film 5 after polishing may have a thickness that ranges from $0.04\lambda$ to $0.28\lambda$, which is approximately 0.16 to 1.1 µm. The upper surfaces of the IDTs 3 may be exposed on the dielectric film 5. In other words, the upper surfaces of the IDTs 3 may be flush with the surface of the dielectric film 5. However, preferably, the upper surfaces of the IDTs 3 may not be exposed, in terms of the joining strength with the surface of the dielectric film 7. In other words, preferably, the dielectric film 5 covers the IDTs 3.

Figure 8A:
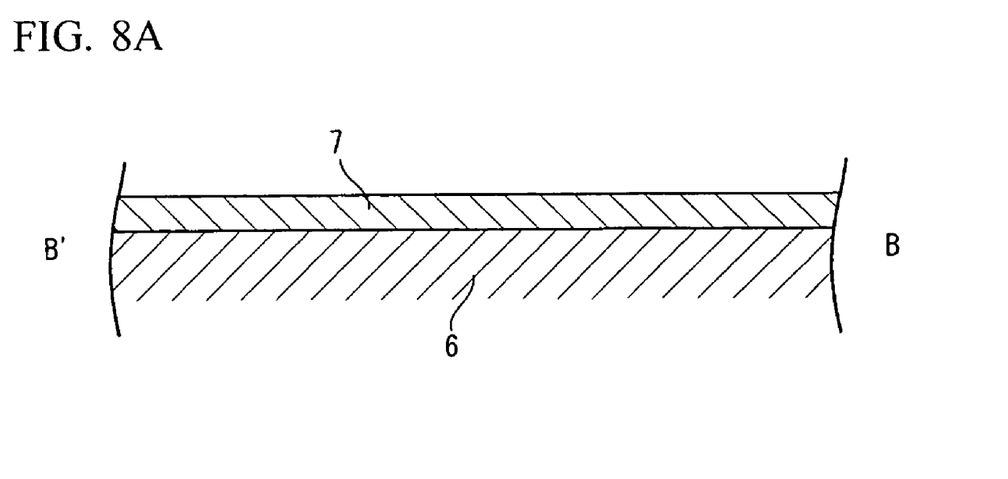
FIGS. 8A and 8B show a manufacturing process of the elastic boundary wave device 1 in accordance with the first embodiment of the present invention.

Referring to FIG. 8A, the dielectric film 7 having a given thickness is provided on the main surface of the second substrate 6 by, for example, sputtering. Alternatively, the surface of the second substrate 6 may be thermally oxidized. The dielectric film 7 is controlled in order to obtain a desired total thickness of the dielectric films 5 and 7. For instance, the thickness of the dielectric film 7 may be $0.2\lambda$ to $0.6\lambda$, which is approximately equal to 0.8 to 2.4 µm.

The dielectric film 7 thus provided has a smooth surface. This is because the second substrate 6 has a smooth surface. The surface of the dielectric film 5 has been smoothed, as described above. Thus, the smooth surface of the dielectric film 7 may be evenly joined and contacted to the smoothed surface of the dielectric film without any void or gap.

Figure 8B:
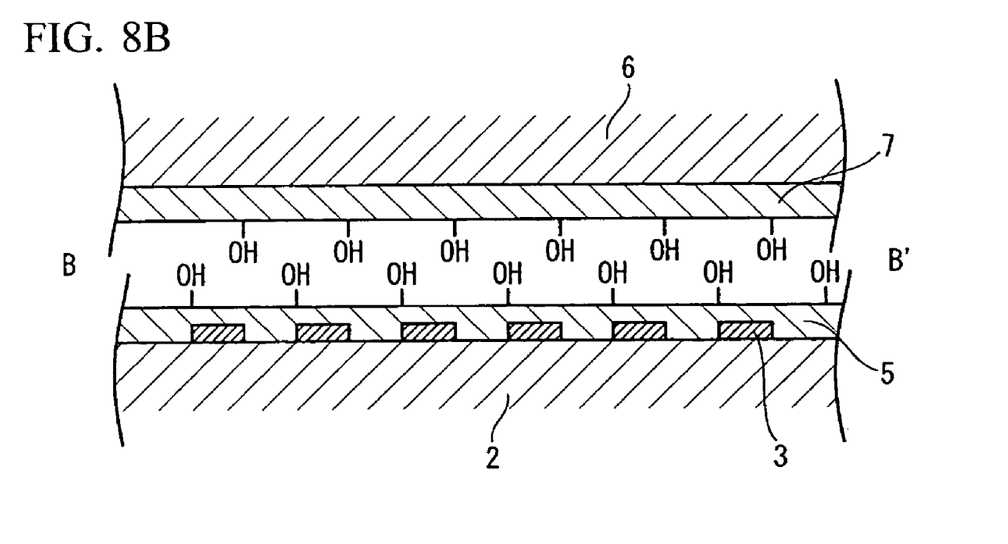

As described above, the first substrate 2 having the dielectric film 5 thereon and the second substrate 7 having the dielectric film 7 thereon are thus produced. Referring to FIG. 8B, the smoothed surface 4 of the dielectric film 5 and the smooth surface of the dielectric film 7 are joined together. For instance, the surfaces of the dielectric films 5 and 7 to be joined are hydrated with peroxide ammonia water, and are heated at approximately 300° C. for one to two hours. With this thermal treatment, OH groups on the respective surfaces form a chemical union, and $H_2O$ is liberated. It is thus possible to directly join the dielectric films 5 and 7, so that the first substrate 2 and the second substrate 6 can be joined together. If the heating temperature is 100° C. or less during the thermal treatment, the OH groups may not form a chemical union. In the case where the heating temperature is 1000° C. or higher during the thermal treatment, the heat may thermally affect some component materials, which may be the dielectric films 5 and 7, the first substrate 2, the second substrate 6, or the IDTs 3. This may degrade the performance of the elastic boundary wave device. Preferably, the heating temperature is set as low as possible in order to avoid a warp due to the difference in the linear expansion coefficient between the first substrate 2 and the second substrate 6. Therefore, the thermal treatment is preferably carried out in the range of 100 to 1000° C. In addition, the joining method of hydroxylation treatment with peroxide ammonia water is less expensive and is easily implemented. This reduces the production cost.

With the above-mentioned process, it is possible to manufacture the elastic boundary wave device in accordance with the first embodiment of the present invention.

In some cases, preferably, the elastic boundary wave device thus produced has an arrangement in which the dielectric film 5 and the dielectric film 7 has an identical thickness. More specifically, the thickness of the dielectric film 5 and that of the dielectric film 7 are equal to each other and are respectively half that of the interposer sandwiched between the first substrate 2 and the second substrate 6. This will be described below.

The internal stress is caused between the dielectric film 5 and the first substrate 2 when the dielectric film 5 is provided. The internal stress depends on the thickness of the dielectric film 5, and increases as the thickness increases. It is thus preferable to form the dielectric film 5 as thin as possible in order to suppress warping of the substrate. The warping occurs while the dielectric film 5 is being formed. The above phenomenon holds true for the combination of the dielectric film 7 and the second substrate 6. The factors of warping of the substrates 2 and 6 may be the difference in the linear expansion coefficient $\alpha_{11}$ or the difference in the TCV between the dielectric films 5 and 7 and the substrates 2 and 6, or the methods or conditions for forming the dielectric films 5 and 7. Preferably, these factors are considered in order to design the thicknesses of the dielectric films 5 and 7 to meet the desired total thickness. Here, the desired total thickness denotes that of the intermediate layer that realizes the zero-temperature characteristic. Preferably, the dielectric films 5 and 7 have an identical thickness when the substrates 2 and 6 are expected to have great warping. In contrast, if one of the substrates 2 and 6 is expected to be greatly warped, the dielectric films 5 and 7 may have greatly different thicknesses.

The dielectric films 5 and 7 may be joined by a process other than the above-mentioned process in which the joined surfaces are dehydrated and are thermally processed. For example, the surface activation treatment may be applied to the surfaces of the dielectric films 5 and 7, which are then joined under a certain pressure. The surface activation treatment may use argon (Ar) atoms, which are irradiated onto the joined surfaces. Plasma of oxygen ions or the like may be substituted for Ar atoms.

The surface activation process does not need thermal treatment of the dielectric films 5 and 7. It is thus possible to greatly suppress warping of the substrates 2 and 6 and breakaway thereof and prevent the component materials from being thermally affected. In addition, irradiation of atoms or ions contributes to not only activating the joined surfaces but also cleaning up these surfaces. Preferably, the joining process is performed in vacuum. This can prevent impurities from adhering to the joined surface again.

As described above, the dielectric film interposer between the substrates 2 and 6 are divided into the dielectric films 5 and 7, which are provided to the substrates 2 and 6, respectively. It is thus possible to reduce the thickness of the dielectric films 5 and 7. This makes it possible to suppress the internal stress caused when the dielectric films 5 and 7 are formed and to suppress warping of the substrates 2 and 6. As a result, the joining strength between the substrates 2 and 6 can be maintained evenly over the joined surfaces.

Second Embodiment

A description will now be given of a second embodiment, with reference to the accompanying drawings in which the same components and configurations as those of the first embodiment have the same reference numerals and a detailed explanation will be omitted, if not otherwise specified.

Figure 9:
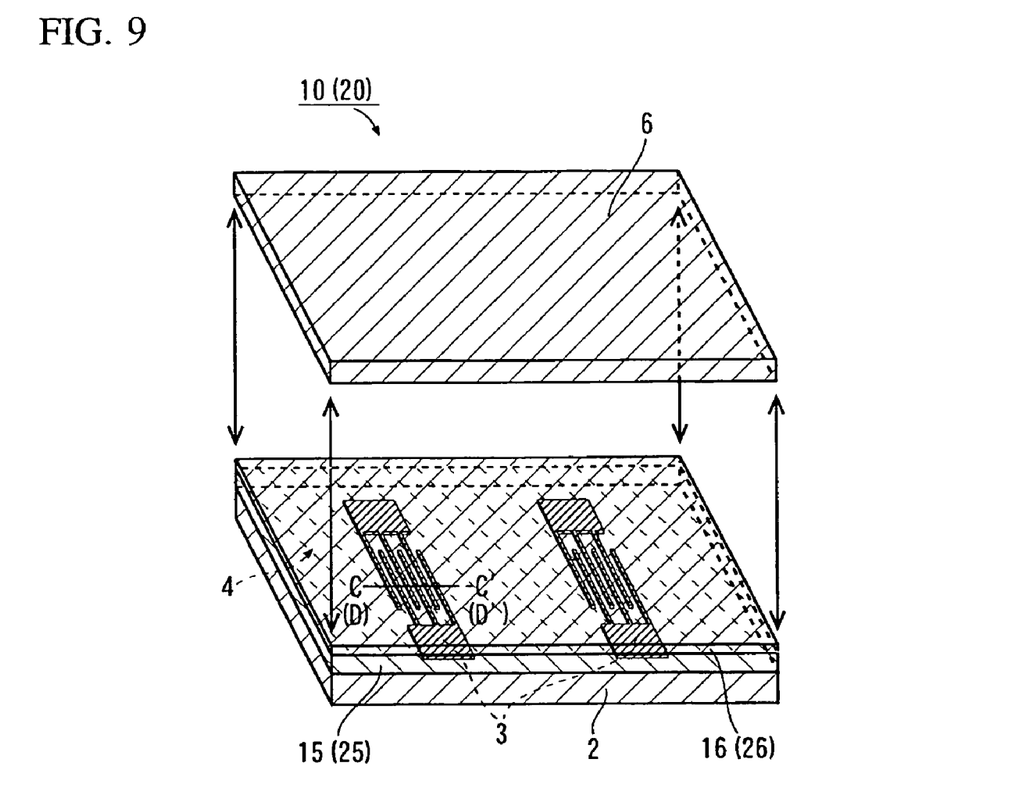
FIG. 9 is an exploded perspective view of an elastic boundary wave device 10 (20) in accordance with a second (third) embodiment of the present invention.
Figure 10:
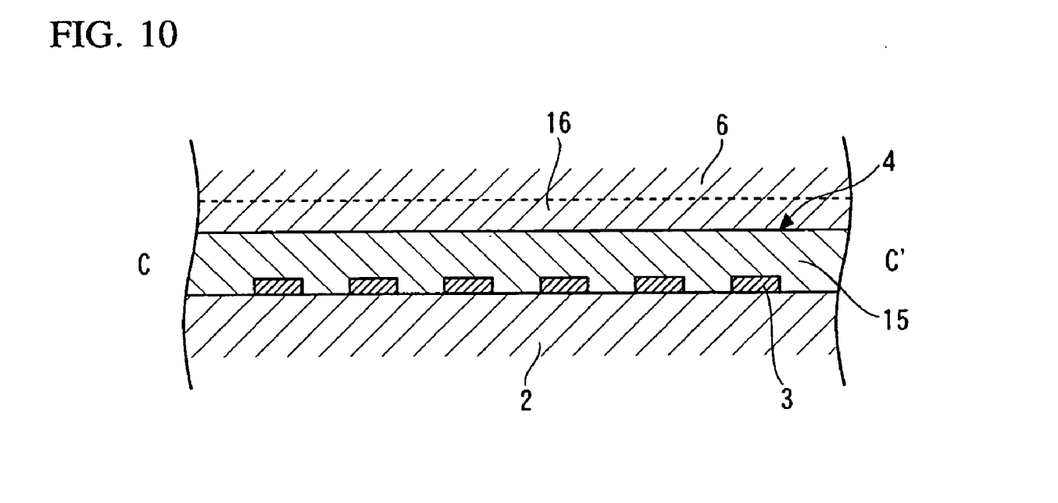
FIG. 10 is a cross-sectional view taken along a line C—C' shown in FIG. 9.

FIG. 9 is an exploded perspective view of an elastic boundary wave device 10 in accordance with the second embodiment of the present invention. FIG. 10 is a cross-sectional view taken along a line C-C' shown in FIG. 9. The following description is directed to the elastic boundary wave device 10 for high frequency signals in the 1 GHz band.

Referring to FIGS. 9 and 10, the elastic boundary wave device 10 includes the first piezoelectric substrate 2, IDTs 3 arranged on the main surface of the first substrate 2, a dielectric film 15 that covers the IDTs 3 and has a smoothed surface 4, a silicon-based thin film 16 provided on a surface of the dielectric film 15, and the silicon-based second substrate 6. A surface of the silicon-based thin film 16 and a surface of the second substrate 6 are joined together. That is, silicon-based materials are joined together in accordance with the second embodiment of the present invention. The thin film 16 has a smoothed surface to be joined and the second substrate 6 has a smooth surface.

The dielectric film 15 is an interposer sandwiched between the first substrate 2 and the second substrate 6. That is, the dielectric film 15 corresponds to the dielectric films 5 and 7 that have been joined in the first embodiment of the present invention. The dielectric film 15 can be made of a silicon-based dielectric material, such as oxide silicon ($SiO_2$). The thickness of the dielectric film 15 may be for example, $0.6\lambda$, as described in the first embodiment of the present invention.

The surface of the dielectric film 15 is smoothed to have the smoothed surface 4 in order to readily arrange the thin film 16 having a smooth surface thereon.

The thin film 16 may be made of the same material as that of the second substrate 6. The lower limit of the thickness of the thin film 16 is theoretically equal to the thickness that allows the silicon films to face each other at the time of joining the thin film 16 to the second substrate 6. The upper limit is equal to the thickness that can maintain a uniform thickness. For example, the thin film 16 may have a thickness of 0.1 μm. The dielectric film 15 has the smoothed surface 4, which allows the thin film 16 to have a smooth and uniform surface.

Next, a description will be given of a manufacturing method of the elastic boundary wave device 10 in accordance with the second embodiment of the present invention, with reference to the accompanying drawings. FIGS. 11A through 11D show a manufacturing process of the elastic boundary wave device 10. Some processes of the following manufacturing method are the same as those of the method used in the first embodiment.

Figure 11A:
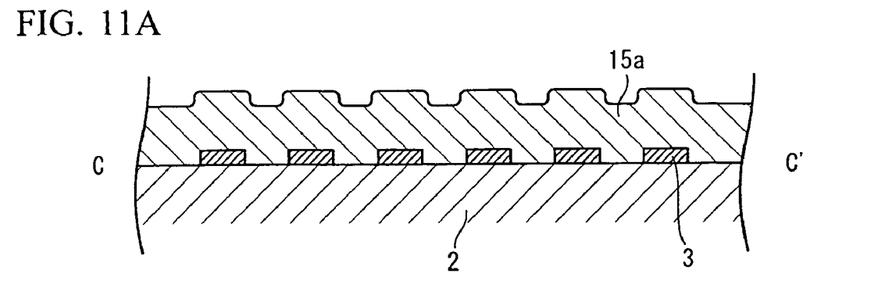
FIGS. 11A through 11D show a manufacturing process of the elastic boundary wave device 10 in accordance with the second embodiment of the present invention.
Figure 11B:
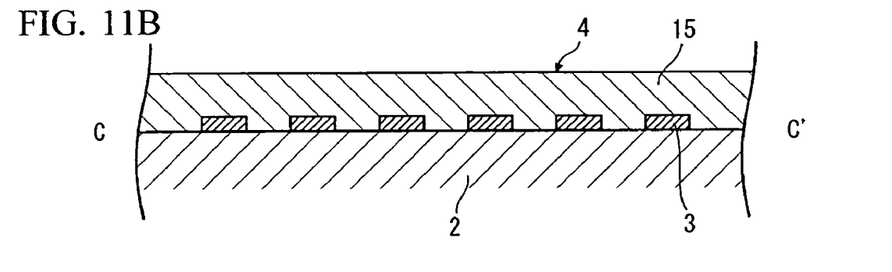

A metal pattern including the IDTs 3 is arranged on the main surface of the first substrate 2 by the processes shown in FIGS. 7A and 7B. Next, as shown in FIG. 11A, an $SiO_2$ film 15a is formed on the main surface of the first substrate 2 on which the metal pattern is arranged. This is performed by sputtering, for example. Here, the $SiO_2$ film 15a has a thickness equal to or greater than those of the IDTs 3 and the dielectric film 15. For example, the $SiO_2$ film 15a has a thickness of $0.5\lambda$ to $0.7\lambda$, which is approximately equal to 2.0 to 2.8 μm. The thickness of the dielectric film 15 denotes a length from the first substrate 2 to the surface of the dielectric film 15.

The $SiO_2$ film 15a thus provided has an uneven surface resulting from the IDTs 3. Therefore, with reference to FIG. 11B, the surface of the $SiO_2$ film 15a is polished by CMP to have the smoothed surface 4 and a desired thickness. The desired thickness denotes the thickness that can realize the zero-temperature characteristic, and is equal to, for example, $0.6\lambda$.

Figure 11C:
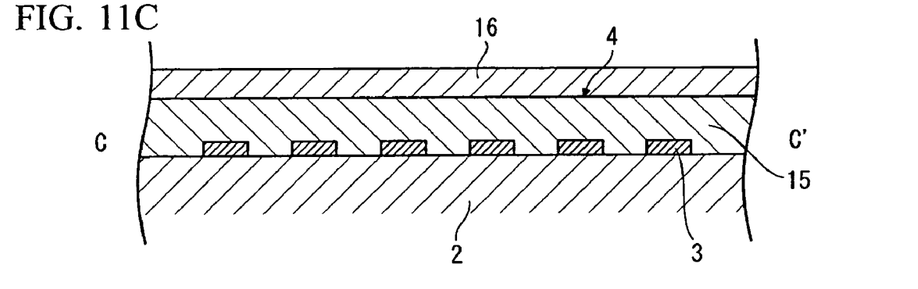

Then, the thin film 16 having a thickness of 0.1 μm is provided on the smoothed surface 4 by sputtering or CVD, as shown in FIG. 11C.

The thin film 16 thus provided has a smooth surface because the dielectric film 15 has the smoothed surface 4. The second substrate 6 also has a smooth surface, as described above. Therefore, in the joining process, both the smooth surfaces are brought into contact uniformly without any void or gap.

Figure 11D:
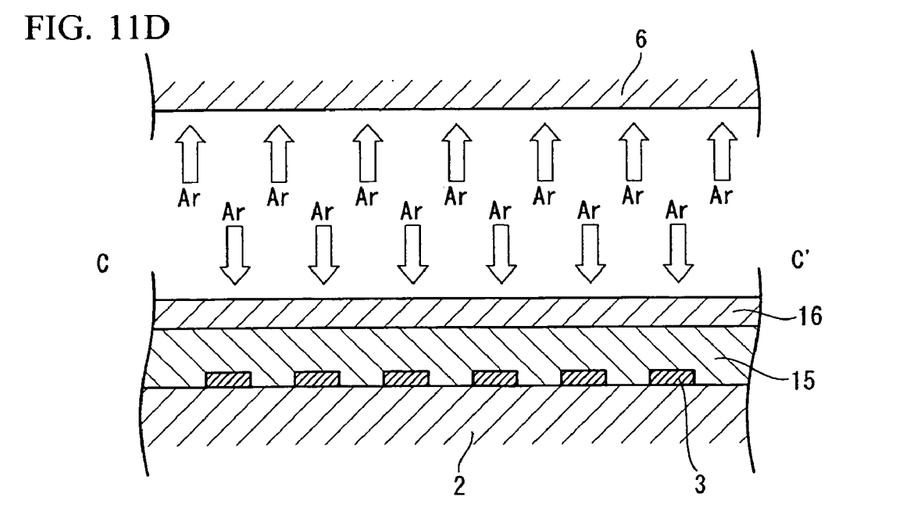

The surface activation treatment may be applied to the joined surfaces of the thin film 16 and the second substrate 6 under a certain pressure, as shown in FIG. 11D. In this manner, the thin film 16 and the second substrate 6 can be joined. The surface activation process may use argon (Ar) atoms or plasma of oxygen ions.

The surface activation process does not need thermal treatment for joining the silicon-based thin film 16 and the silicon-based second substrate 6. It is thus possible to greatly suppress warping of the substrates 2 and 6 and breakaway thereof and prevent the component materials from being thermally affected. In addition, irradiation of atoms or ions contributes to not only activating the joined surfaces but also cleaning up these surfaces. Preferably, the joining process is performed in vacuum. This can prevent impurities from adhering to the joined surface again.

In the case where two types of substrates are joined together at room temperature with the use of the surface activation treatment, a higher joining strength is obtainable when two silicon substrates are joined, as compared to two $SiO_2$ substrates. Thus, it is preferable to employ the surface activation treatment rather than hydroxylation treatment in joining of the silicon-based thin film 16 and the silicon-based second substrate 6. It is possible to substantially suppress warping of the substrate that will be caused after joining process.

As described above, it is to be noted that the first substrate 2 and the second substrate 6 can be joined at room temperature. It is thus possible to avoid warping of the substrates due to the difference in the thermal expansion between the first substrate 2 and the second substrate 6.

Third Embodiment

A description will now be given of a third embodiment of the present invention in which the same components and configurations as those of the first and second embodiments have the same reference numerals and a detailed explanation will be omitted, if not otherwise specified.

Figure 12:
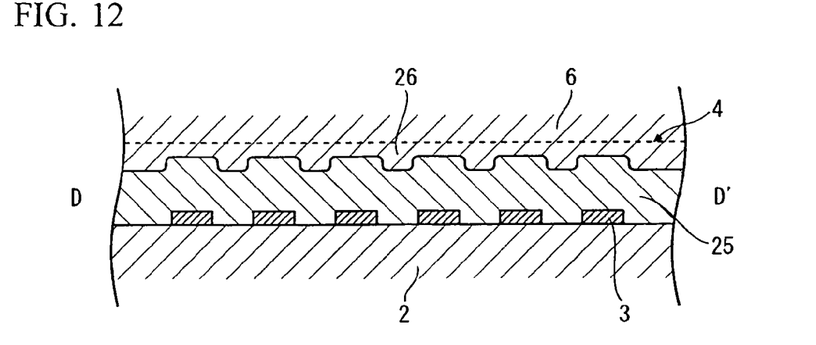
FIG. 12 is a cross-sectional view taken along a line D-D' shown in FIG. 9.

FIG. 9 also shows an elastic boundary wave device 20 of the third embodiment. FIG. 12 is a cross-sectional view taken along a line D-D' shown in FIG. 9. The following description is directed to the elastic boundary wave device 20 for high frequency signals in the 1 GHz band.

Referring to FIGS. 9 and 12, the elastic boundary wave device 20 includes the first piezoelectric substrate 2, the IDTs 3 on the main surface of the first substrate 2, a dielectric film 25 that covers the IDTs 3, a silicon-based thin film 26 that is provided on the surface of the dielectric film 25 and that has the smoothed surface 4, and the silicon-based second substrate 6. The silicon-based thin film 26 and the second silicon-based substrate 6 are joined together. The second substrate 6 has the smooth surface.

The first substrate 2, the IDTs 3, and the second substrate 6 are the same as those of the first embodiment. The third embodiment differs from the second embodiment, in which the surface of the dielectric film 25 is uneven and the surface of the thin film 26 is even.

The dielectric film 25 is an interposer provided between the first substrate 2 and the second substrate 6. The dielectric film 25 is the $SiO_2$ film 15a that is formed in the process of FIG. 11A. The surface of the dielectric film 25 is not polished in the present embodiment. The dielectric film 25 may be 0.6λ thick, as in the case of the first embodiment. The thickness of the dielectric film 25 denotes a thickness from the bottom of a dented portion to the first substrate 2.

It is difficult to control the thickness of the dielectric film 25 in polishing. With the above in mind, the smoothed surface 4 is defined by polishing the silicon-based thin film 26 provided on the surface of the dielectric film 25.

The thin film 26 may be made of the same material as that of the second substrate 6. The thin film 26 has a lower limit on the thickness that allows the silicon films 26 and 6 to be joined to face each other at the time of joining the dielectric film 26 to the second substrate 6. For example, the thin film 26 is 0.1 μm thick.

The elastic boundary wave device 20 can be fabricated as follows. Some processes of the following manufacturing method are the same as those used in the first and second embodiments.

Figure 13A:
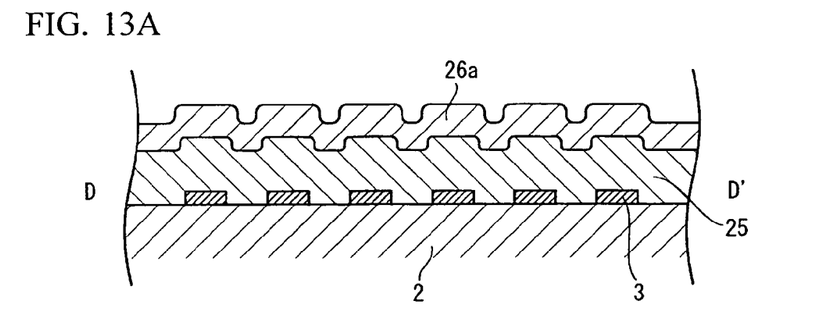
FIGS. 13A through 13C show a manufacturing process of an elastic boundary wave device 20 in accordance with a third embodiment of the present invention.

The metal pattern including the IDTs 3 and the dielectric film 25 are provided on the main surface of the first substrate 2 by the processes as shown in FIGS. 7A, 7B and 11A. The dielectric film 25 is the $SiO_2$ film. Then, as shown in FIG. 13A, the silicon-based thin film 26a is provided on the surface of the dielectric film 25 by sputtering. The dielectric film 26a has a thickness equal to or greater than that the distance between the top and bottom on the rough surface of the dielectric film 25. For example, the thickness may be from 0.3 to 1.0 μm. Alternatively, CVD may be used to form the thin film 26a.

Figure 13B:
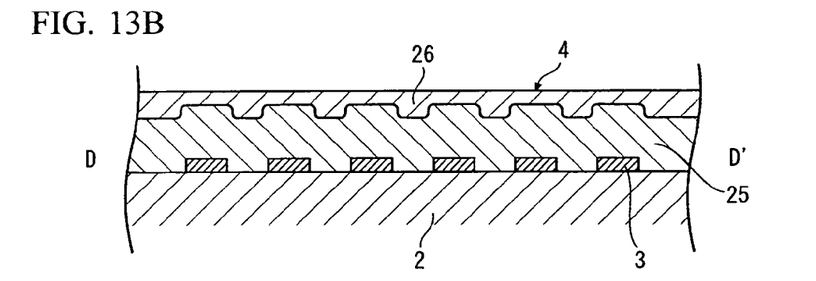

The thin film 26a has a rough surface because the dielectric film 25 has a rough surface. As shown in FIG. 13B, the surface of the thin film 26a is polished by CMP to have the smoothed surface 4. The thin film 26 may be 0.1 μm thick after polishing.

The second substrate 6 also has the smooth surface. Therefore, the thin film 26 and the second substrate 6 can be brought into contact with each other without void or gap.

Figure 13C:
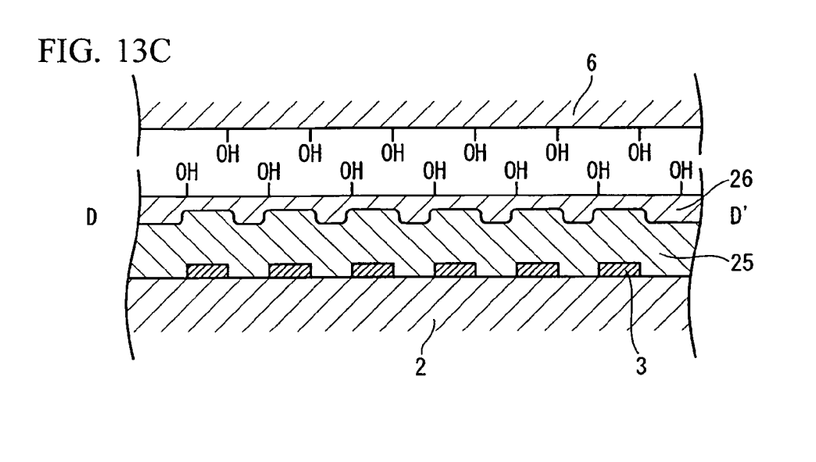

As shown in FIG. 13C, the surface activation treatment is applied to the surfaces of the thin film 26 and the second substrate 6, which are then joined under a certain pressure. The subsequent processes are the same as those of the second embodiment (see FIG. 11D).

According to the third embodiment, the polishing process can be facilitated in addition to the effects obtained with the second embodiment.

The present invention is not limited to the specifically disclosed embodiments, and other embodiments, variations and modifications may be made without departing from the scope of the present invention.

The present invention is based on Japanese Patent Application No. 2003-382346 filed on Nov. 12, 2003, the entire disclosure of which is hereby incorporated by reference.

What is claimed is:

1. An elastic boundary wave device comprising:
    a first piezoelectric substrate that has comb-like electrodes that excite elastic waves and are arranged on a main surface thereof, a first dielectric film that covers the comb-like electrodes and has a smoothed surface; and
    a second substrate having a second dielectric film arranged on a main surface thereof, the smoothed surface of the first dielectric film and the second dielectric film being joined together.

2. The elastic boundary wave device as claimed in claim 1, wherein:
    the second substrate is made of a silicon-based material; and
    the first dielectric film and the second dielectric film are made of SiO.sub.2 and have temperature coefficients of phase velocity having signs opposite to those of the first substrate and the second substrate, respectively.

3. The elastic boundary wave device as claimed in claim 1, wherein the first dielectric film and the second dielectric film have an identical thickness.

4. An elastic boundary wave device comprising:
    a first piezoelectric substrate that has comb-like electrodes that excite elastic waves and are arranged on a main surface thereof, a dielectric film that covers the comb-like electrode;
    a thin film that covers the dielectric film and has a smoothed surface; and
    a second substrate, the thin film and the second substrate being joined together.

5. The elastic boundary wave device as claimed in claim 4, wherein the dielectric film has a smoothed surface on which the thin film is arranged.

6. The elastic boundary wave device as claimed in claim 4, wherein:
    the second substrate and the thin film are made of silicon-based materials; and
    the dielectric film is made of silicon-based material and has a temperature coefficient of phase velocity having a sign opposite to that of the first substrate or the second substrate.

* * * * *